United States Patent [19]

Murasawa et al.

[11] Patent Number: 5,055,912
[45] Date of Patent: Oct. 8, 1991

[54] SEMICONDUCTOR DEVICE

[75] Inventors: Yasuhiro Murasawa; Hitoshi Toda; Hiroshi Sawano; Hideya Yagoura, all of Itami, Japan

[73] Assignee: Mitsubishi Denki Kabushiki Kaisha, Japan

[21] Appl. No.: 577,111

[22] Filed: Sep. 4, 1990

[30] Foreign Application Priority Data

May 18, 1990 [JP] Japan .................................. 2-126981

[51] Int. Cl.⁵ ...................... H01L 23/02; H01L 23/12
[52] U.S. Cl. ......................................... 357/74; 357/80; 357/68; 357/65
[58] Field of Search ...................... 357/74, 80, 68, 65

[56] References Cited

FOREIGN PATENT DOCUMENTS 0181149 11/1982 Japan ...................................... 357/80
0016552 1/1987 Japan ...................................... 357/74
0199453 8/1988 Japan ...................................... 357/74
0262651 10/1989 Japan ...................................... 357/74

Primary Examiner—Andrew J. James
Assistant Examiner—T. Davenport
Attorney, Agent, or Firm—Leydig, Voit & Mayer

[57] ABSTRACT

A semiconductor device mounted on a substrate. Outer leads, partially resin-molded, have a greater height above the mounting surface than that of a conventional device. Specifically, each lead projecting from the molded resin has a bent portion which is convex in the direction opposite to the mounting surface, and the length of the lead beyond the bent portion is greater than the distance from the lead portion adjacent to the resin portion of the lead to the mounting surface. The long leads improve reliability during, e.g., heat cycle, tests. In another embodiment, outer leads, partially resin-molded, have reverse J-shaped bent portions, each with a distal end positioned away from the resin. When the bent portions serve as soldering portions, the soldering condition can be easily checked.

3 Claims, 3 Drawing Sheets

SEMICONDUCTOR DEVICE

BACKGROUND OF THE INVENTION

1. Field of the Invention

The present invention relates to semiconductor devices and, more particularly, to semiconductor devices which are mounted o substrates on at least one of their respective surfaces (i.e., which are of "surface mounting type").

2. Description of the Related Art

FIGS. 1 to 3 are side views of conventional semiconductor devices ,of the surface mounting type. The illustrated devices are packages having outer leads of different configurations. FIG. 1 shows a small outline package 4a with gull-wing leads, FIG. 2 shows a small outline package 4b with I leads, and FIG. 3 shows a small outline package 4c with J leads.

In each semiconductor device 4a, 4b or 4c, a semiconductor element (not shown) and outer leads (hereinafter abbreviated to "leads") 2a, 2b or 2c electrically connected to the element are molded with resin to form a package body 1a, 1b or 1c. Parts of the leads 2a, 2b or 2c project outward from the package body 1a, 1b or 1c, and the projecting end portions of the leads are formed with soldering portions 3a, 3b or 3c. The semiconductor device 4a, 4b or 4c is mounted on a substrate or the like (not shown) by soldering the soldering portions 3a, 3b or 3c.

The semiconductor devices, which are mounted on the substrates or the like by soldering, entail the following problems when they are subjected to reliability tests such as heat cycle tests where the temperature surrounding the device is varied between high and low temperatures. The semiconductor device 4a or 4b shown in FIG. 1 or 2 entails a problem. Due to the difference in the coefficient of thermal expansion between the package body 1a or 1b and the substrate, cracks are formed in solder (not shown) attached to the soldering portions 3a or 3b. The semiconductor device 4c shown in FIG. 3 entails a problem that since the curved and J-shaped end portions of the outer leads 2c are positioned on the reverse side of the package body 1c and are therefore difficult to see from the front side. Their soldering condition can be checked only with difficulty.

SUMMARY OF THE INVENTION

The present invention has been accomplished with a view to eliminating the above-described problems.

It is an object of the present invention to provide a semiconductor device compensating for stress applied to the soldering portions of the outer leads, and exhibiting high reliability in heat cycles.

It is another object of the present invention to provide a semiconductor device of which the soldering condition can be checked with ease, and which can be mounted on the substrate on one or both of the upper and lower surfaces of the device.

According to one aspect of the present invention, there is provided a semiconductor device of the surface mounting type comprising: a resin-molded semiconductor element; and outer leads electrically connected to the semiconductor element and resin-molded together therewith while partially projecting outwardly from the resin, the projecting part of each of the leads having a portion adjacent to the resin, and a portion for soldering to a substrate, wherein the projecting part of each lead further has a bent portion which is convex in the direction opposite to the surface of a substrate on which the device is to be mounted, and wherein the length of each lead that is beyond the bent portion is greater, than, the distance from the lead portion adjacent to the resin to the plane including the mounting surface of the device.

According to another aspect of the present invention, there is provided a semiconductor device of the surface mounting type comprising: a resin-molded semiconductor element; and outer leads electrically connected to the semiconductor element and resin-molded together therewith while partially projecting outwardly from the resin, wherein the projecting part of each of the leads has a reverse J-shaped bent portion with the distal end positioned away from the resin, the reverse J-shaped bent portion serving as a soldering portion when the device is mounted on a substrate on a first surface thereof.

DESCRIPTION OF THE PREFERRED EMBODIMENTS

Figure 4:
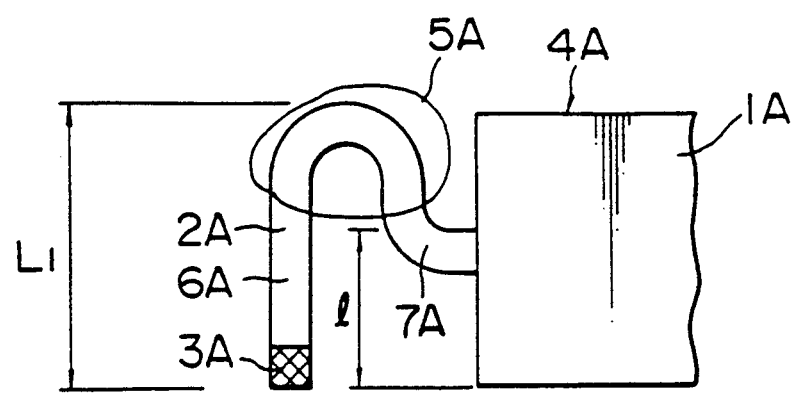
FIG. 4 is a side view showing parts of a semiconductor device according to one embodiment of the present invention.

FIG. 4 shows essential parts of a semiconductor device according to one embodiment of the present invention as viewed from the side. As shown in the figure, a semiconductor device 4A has leads 2A projecting from the sides of a package body IA, the distal end portion of each lead 2A serving as a soldering portion 3A. Each lead 2A is bent to form a bent portion which is convex (as denoted at 5A) in the direction opposite to the side on which the device 4A is soldered. At this time, the length $L_l$ of a straight portion 6A beyond the bent portion of the lead 2A, in other words, the lead height, is made greater than the height I from a portion 7A of the lead 2A which is adjacent to the package body 1A to the plane of the bottom surface of the body 1A. Thus, the bending of each lead is such that the relation $L_1 > 1$ stands.

With the semiconductor device 4A having the above-described arrangement, since the length Ll of the straight portion 6A of each lead 2A is greater than the height 1, thermal stress generated during, e.g., heat cycle tests can be mitigated by the leads 2A. Accordingly, crack formation in the soldered portions due to stress applied thereto is prevented and prevents any insulation failure in the semiconductor device 4A.

Heat cycle tests were conducted on the semiconductor device 4A according to this embodiment and a conventional thin-type package in which a TSOP package was soldered on a glass-epoxy substrate. In the tests, the temperature surrounding the devices was varied throughout the range from −40 to 125° C. As a result, the conventional semiconductor device encountered insulation failure due to crack formation in the soldering portions after the heat cycle had been repeated about 300 times. On the other hand, the semiconductor device 4A according to the embodiment remained free from insulation failure until about the 1000th heat cycle.

Figure 5:
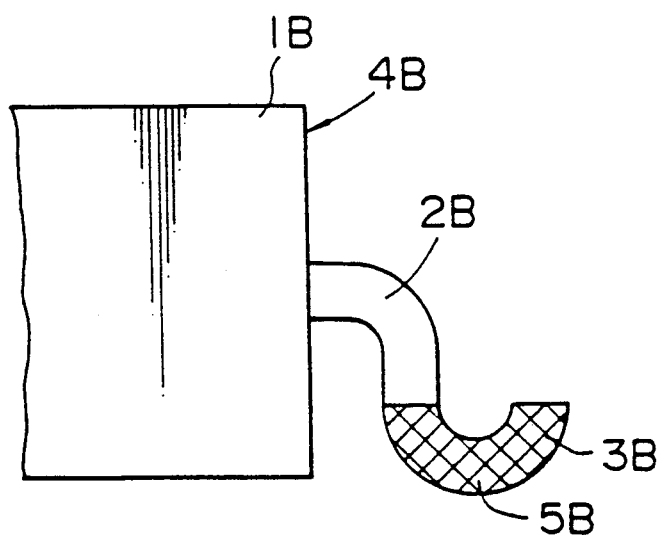
FIG. 5 is a side view showing parts of a semiconductor device according to another embodiment of the present invention.

In the second embodiment shown in FIG. 5, a semiconductor device 4B has leads 2B. The end portions of the leads 2B which are on the side where the device 4B is soldered are each formed as a reverse J-shaped bent portion which is convex as denoted at 5B, with the distal end positioned away from a package body IB. This is for the following reason.

Figure 1:
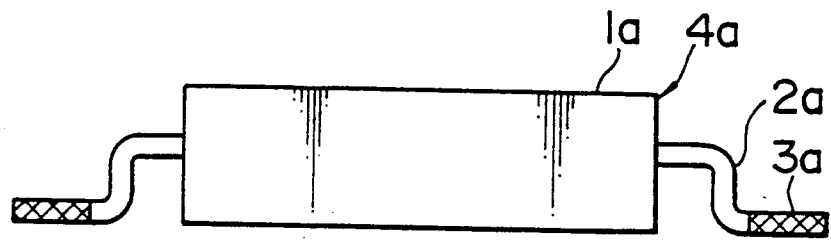
FIGS. 1 to 3 are side views of conventional semiconductor devices.

It is known that the conventional semiconductor device 4c (in FIG. 3) having J leads exhibits higher reliability in heat cycle tests than the semiconductor device 4a (in FIG. 1) having gull-wing leads or the semiconductor device 4b (in FIG. 2) having I leads. However, the conventional device 4c is disadvantageous in that, since the soldering portion 3c is positioned on the reverse side of the package body 1c, the soldering condition can be checked only with difficulty. In contrast, with the semiconductor device 4B (in FIG. 5) since the soldering portion 3B is not positioned on the reverse surface of the package body IB, the soldering condition can be checked with ease.

Figure 6:
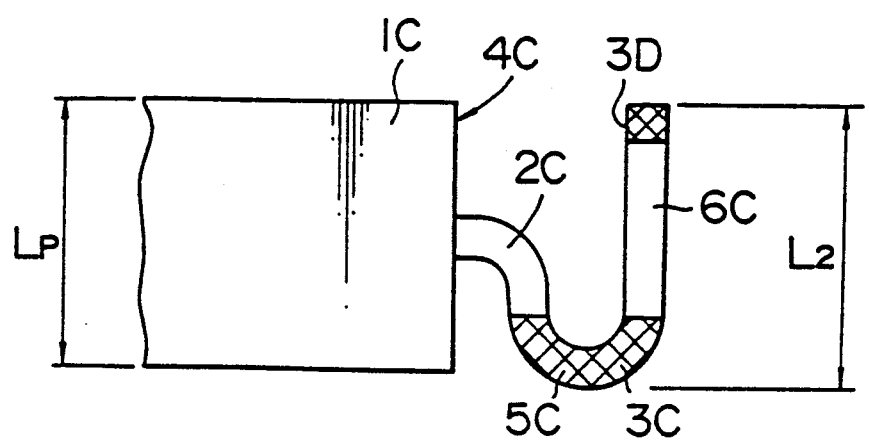
FIGS. 6 and 7 are side views which each show parts of a semiconductor device according to a different modification of the embodiment shown in FIG. 5.

As shown in FIG. 6, the arrangement shown in FIG. 5 may be modified so that each lead 2C has a straight portion 6C continuing from the J-shaped bent portion which is convex as denoted at 5C, and extending from the plane including the upper surface of the package body 1C. Another soldering portion 3D is provided at the distal end of the lead portion 6C. This modification allows the package body 1C to be soldered on one or both of the lower and upper surfaces thereof. In such a semiconductor device 4C, the formation of the leads 2C is facilitated.

Figure 7:
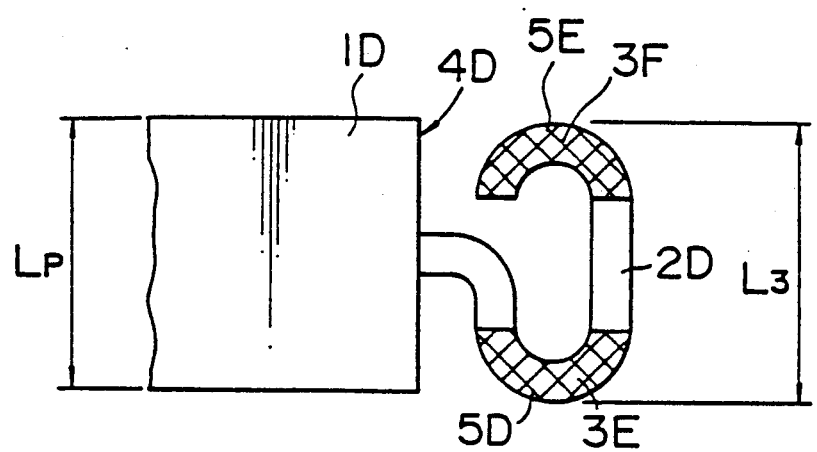

As shown in FIG. 7, the arrangement shown in FIG. 6 may be modified so that the distal end portion of a lead 2D which continues from the straight portion is bent toward a package body ID, and another convex portion 5E, serving as another soldering portion 3F, is formed. With this modification, therefore, each lead 2D has lower and upper reverse J-shaped bent portions. Accordingly, if one or both of the convex portions 5D and 5E are soldered, the semiconductor device 4D is mounted on a substrate or substrates on one or both of the lower and upper surfaces of the device 4D.

Figure 2:
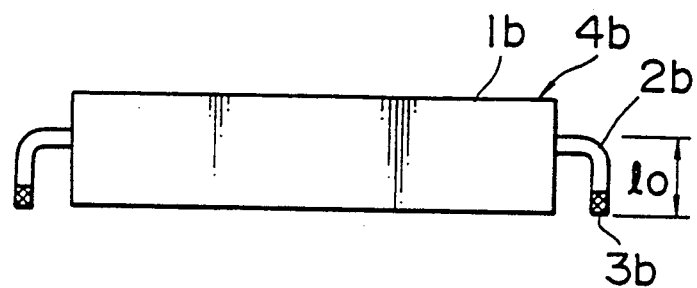
Figure 3:
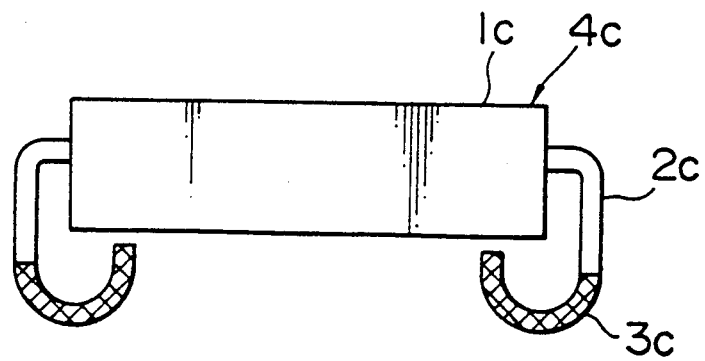

If the semiconductor device 4C shown in FIG. 6 is mounted on a substrate by soldering the portions 3D, the lead height $L_2$ is about two times greater than the height Io of the conventional I leads shown in FIG. 2. In this case, therefore, the semiconductor device 4C exhibits high reliability in heat cycle tests.

If the semiconductor device 4C or 4D shown in FIG. 6 or 7 is to be mounted on substrates on both the upper and lower surfaces, it is necessary that the thickness $L_P$ of the package 1C or 1D satisfy the relation $L_P < L_2$ or $L_3$.

However, if the semiconductor device 4D shown in FIG. 7 is to be mounted on a substrate by soldering only the soldering portion 3F, the device 4D exhibits improved reliability in heat cycle tests even if $L_P > L_3$. If other soldering portion 3E is unnecessary, it may have any configuration so long as the portion 3E is on the side that is not the side where the device 4D is soldered.

Although in the above described embodiments, the convex portion 5A has a semi-circular configuration, if it is on the side which is not the side where the device is soldered, the portion 5A may have any configuration.

Further, each of the soldering portions 3A, 3D and 3F may have any configuration, such as that of the soldering portion of a gull-wing lead, a J lead and the like.

What is claimed is:

1. A surface mount semiconductor device comprising:
   a semiconductor element molded in a resin to form a surface mount semiconductor device, the resin including opposed first and second surfaces, the first surface being a substantially planar mounting surface of disposition adjacent to a substrate on which the surface mount semiconductor device is mounted; and
   leads electrically connected to said semiconductor element, partially disposed within the resin and partially projecting outwardly from the resin, the projecting part of each lead having a portion adjacent to the resin and a portion spaced from the resin, each lead including an end for soldering to a substrate on which the surface mount semiconductor device is mounted, wherein the projecting part of each lead has a bent portion convex relative to the mounting surface of the surface mount semiconductor device, the length of each lead beyond the bent portion is greater than the distance from the portion of each lead adjacent to eh resin to the plane including the mounting surface of the surface mount semiconductor device, and each end lies substantially within the plane including the mounting surface of the surface mount semiconductor device.

2. A surface mount semiconductor deiced comprising:
   a semiconductor element molded in a resin to form a surface mount semiconductor device, the resin including opposed first and second surfaces, the first surface being a substantially planar mounting surface for disposition adjacent to a substrate on which surface mount semiconductor device is mounted; and
   leads electrically connected to said semiconductor element, partially disposed within the resin, partially projecting outwardly from the resin, the projecting part of each of the leads having a portion adjacent to the resin and a portion spaced from the resin fold soldering to a substrate on which surface mount semiconductor device is mounted, wherein the projecting part of each lead has a J-shaped bent portion including a surface lying substantially within the plane including the mounting surface of the surface mount semiconductor device and a second portion extending from the J-shaped portion and having a distal end positioned substantially in the plane including the second surface of the resin.

3. A surface mount semiconductor device comprising:
   a semiconductor element molded in a resin to form a surface mount semiconductor device, the resin including opposed first and second surfaces, the first surface being a substantially planar mounting surface for disposition adjacent to a substrate on which the surface mount semiconductor device is mounted; and
   leads electrically connected to said semiconductor element, partially disposed within the resin, partially projecting outwardly from the resin the projecting part of each of the leads having a portion adjacent to the resin and a portion spaced from the resin for soldering to a substrate on which the surface mount semiconductor device is mounted, wherein the projecting part of each lead has a J-shaped bent portion including the mounting surface of the surface mount semiconductor device, a second portion extending from the J-shaped portion, and a bent third portion concave relative to the mounting surface of the surface mount semiconductor device and extending from the second portion.

* * * * *

UNITED STATES PATENT AND TRADEMARK OFFICE
CERTIFICATE OF CORRECTION

PATENT NO. : 5,055,912

DATED : October 8, 1991

INVENTOR(S) : Murasawa et al

It is certified that error appears in the above-identified patent and that said Letters Patent is hereby corrected as shown below:

In item [57], Abstract, lines 14 and 15, change "soldering" to --solder joint is visible and its--.

Column 4, line 11, change "of" to --for--;
        line 26, change "eh" to --the--;
        line 32, change "deiced" to --device--;
        line 39, after "which" insert --the--;
        line 46, change "from" to --for--;
                after "which" insert --the--;
        line 67, after "resin" insert --,--.

Column 5, line 5, after "including" insert --a surface lying substantially within the plane including--.

Signed and Sealed this

Second Day of March, 1993

*Attest:*

STEPHEN G. KUNIN

*Attesting Officer*      *Acting Commissioner of Patents and Trademarks*